(12) United States Patent
Jai

(10) Patent No.: US 8,737,090 B2
(45) Date of Patent: May 27, 2014

(54) RACK MOUNTED COMPUTER SYSTEM AND CABLE MANAGEMENT MECHANISM THEREOF

(75) Inventor: Ben-Chiao Jai, Taoyuan Hsien (TW)

(73) Assignee: Delta Electronics, Inc., Taoyuan Hsien (TW)

(*) Notice: Subject to any disclaimer, the term of this patent is extended or adjusted under 35 U.S.C. 154(b) by 164 days.

(21) Appl. No.: 13/185,997

(22) Filed: Jul. 19, 2011

(65) Prior Publication Data

US 2012/0293932 A1 Nov. 22, 2012

Related U.S. Application Data

(60) Provisional application No. 61/486,398, filed on May 16, 2011.

(51) Int. Cl.
*H05K 7/02* (2006.01)

(52) U.S. Cl.
USPC ...... 361/826; 361/679.02; 361/724; 361/725; 312/223.6; 211/26

(58) Field of Classification Search
USPC .......................................................... 361/826
See application file for complete search history.

(56) References Cited

U.S. PATENT DOCUMENTS

| | | | | | |
|---|---|---|---|---|---|
| 2,896,009 | A | * | 7/1959 | Caveney | 174/72 A |
| 6,157,534 | A | * | 12/2000 | Gallagher et al. | 361/724 |
| 7,087,840 | B2 | * | 8/2006 | Herring et al. | 174/101 |
| 7,119,280 | B1 | * | 10/2006 | Ray et al. | 174/72 A |
| 7,438,638 | B2 | * | 10/2008 | Lewis et al. | 454/184 |
| 7,562,779 | B2 | * | 7/2009 | Bravo et al. | 211/26 |
| 7,916,502 | B2 | * | 3/2011 | Papakos et al. | 361/826 |
| 8,038,015 | B2 | * | 10/2011 | Laursen et al. | 211/26 |
| RE42,970 | E | * | 11/2011 | Fournier et al. | 211/26 |
| 8,143,521 | B2 | * | 3/2012 | Burek et al. | 174/100 |
| 8,254,148 | B2 | * | 8/2012 | Hsiao et al. | 361/826 |
| 2004/0050808 | A1 | * | 3/2004 | Krampotich et al. | 211/26 |
| 2007/0039902 | A1 | * | 2/2007 | Lawrence et al. | 211/26 |
| 2008/0093101 | A1 | * | 4/2008 | Kessler et al. | 174/58 |
| 2010/0110621 | A1 | * | 5/2010 | Dunn et al. | 361/679.01 |
| 2011/0051341 | A1 | * | 3/2011 | Baldassano et al. | 361/679.02 |
| 2011/0069436 | A1 | * | 3/2011 | Jian | 361/679.02 |
| 2011/0291852 | A1 | * | 12/2011 | Forristal et al. | 340/686.1 |
| 2012/0054405 | A1 | * | 3/2012 | Tolliver | 710/316 |

* cited by examiner

*Primary Examiner* — Anthony Q Edwards
(74) *Attorney, Agent, or Firm* — Kirton McConkie; Evan R. Witt

(57) ABSTRACT

A rack mounted computer system includes a rack, a plurality of modular servers, at least one network switch, a plurality of cables and a cable management mechanism. The rack includes a frame assembly and an interior. The modular servers and the network switch are installed in the interior of the rack. Each of the cables is connected with a corresponding modular server and the network switch. The cable management mechanism is integrally formed with the frame assembly for managing and securing the cables connected between the network switch and the modular servers and includes a polygonal column having an inclined sidewall and a receptacle. The inclined sidewall has a plurality of through holes and an opening arranged apart from each other. The through holes are in communication with the receptacle and respectively configured to contain a corresponding cable extending therethrough. The opening is in communication with the receptacle and configured to collect and contain the cables inserted therethrough. The receptacle is configured for housing the cables.

17 Claims, 4 Drawing Sheets

RACK MOUNTED COMPUTER SYSTEM AND CABLE MANAGEMENT MECHANISM THEREOF

CROSS-REFERENCE TO RELATED APPLICATION

This application claims the benefit of U.S. Provisional Application No. 61/486, 398 filed on May 16, 2011, and entitled "RACK MOUNTED COMPUTER SYSTEM", the entirety of which is hereby incorporated by reference.

FIELD OF THE INVENTION

The present invention relates to rack mounted computer system, and more particularly to a rack mounted computer system with a cable management mechanism for managing and securing cables.

BACKGROUND OF THE INVENTION

With increasing development of information industries and networks, the services provided through networks are becoming more and more popular in various applications. For providing intensive network applications, the numbers of computers or servers of the data center need to be increased to transmit, process, access and communicate data at high speed. A data center is a facility designed for housing one or more rack mounted computer system and associated equipments. Each rack mounted computer system includes a rack, which can accommodate or position the modular IT equipments (i.e. modular servers or network switch) in an organized and closely stacked arrangement so that the space can be utilized efficiently. Typically, the modular IT equipments are retractably inserted from the front of the rack, and various cables are coupled to the IT equipments at the front of the rack. These cables may be routed to other equipments within the rack or may be routed to other devices external to the rack.

The modular server in the rack mounted computer system typically provides at least one network port for coupling with the network switch via the cable so as to make network connection. The cables used to connect the network switch to the modular servers have various lengths and consume considerable space at the front of the rack. In order to route the cables, an additional and detachable cable management device is mounted at the front of the rack for managing and securing the cables. However, the additional cable management device may result in other technical constraints, including restricting movement of the modular servers, restricting the use of front door of the rack, for instance. Due to the restriction of using the front door of the rack, the IT equipments mounted inside the rack can't be protected securely.

Therefore, there is a need of providing a rack mounted computer system with a cable management mechanism for managing and securing cables so as to obviate the drawbacks encountered from the prior art.

SUMMARY OF THE INVENTION

It is an object of the present invention to provide a rack mounted computer system with a cable management mechanism for managing and securing cables without restricting the use of front door of the rack and restricting movement of the modular servers.

It is another object of the present invention to provide a rack mounted computer system with a cable management mechanism, which is integrally formed with the rack, so that the cables can be routed from the network switch to the modular servers more conveniently, accurately and easily and the front door of the rack still can be used to protect the IT equipments.

In accordance with an aspect of the present invention, there is provided a rack mounted computer system including a rack, a plurality of modular servers, at least one network switch, a plurality of cables and a cable management mechanism. The rack includes a frame assembly and an interior. The modular servers and the network switch are installed in the interior of the rack. Each of the cables is connected with a corresponding modular server and the network switch. The cable management mechanism is integrally formed with the frame assembly for managing and securing the cables connected between the network switch and the modular servers and includes a polygonal column having an inclined sidewall and a receptacle. The inclined sidewall has a plurality of through holes and an opening arranged apart from each other. The through holes are in communication with the receptacle and respectively configured to contain a corresponding cable extending therethrough. The opening is in communication with the receptacle and configured to collect and contain the cables inserted therethrough. The receptacle is configured for housing the cables.

In accordance with another aspect of the present invention, there is provided a cable management mechanism, which is integrally formed with a frame assembly of a rack for managing and securing a plurality of cables connected between a network switch and a plurality of modular servers mounted inside the rack. The cable management mechanism includes a polygonal column having an inclined sidewall and a receptacle. The inclined sidewall has a plurality of through holes and an opening arranged apart from each other. The through holes are in communication with the receptacle and respectively configured to contain a corresponding cable extending therethrough. The opening is in communication with the receptacle and configured to collect and contain the cables inserted therethrough. The receptacle is configured for housing the cables.

In accordance with another aspect of the present invention, there is provided a rack mounted computer system including a rack, a plurality of first IT equipments, at least one second IT equipment, a plurality of cables and a cable management mechanism. The rack includes a frame assembly, a front door and an interior, wherein the frame assembly includes a front door frame, and the front door is pivotally connected to the front door frame. The first IT equipments are installed in the interior of the rack. The second IT equipment is installed in the interior of the rack. Each of the cables is connected with a corresponding first IT equipment and the second IT equipment. The cable management mechanism is integrally formed with the front door frame and includes a polygonal column having an inclined sidewall and a receptacle, wherein the inclined sidewall has a plurality of through holes and an opening arranged apart from each other, the through holes are in communication with the receptacle and respectively configured to contain a corresponding cable extending therethrough, the opening is in communication with the receptacle and configured to collect and contain the cables inserted therethrough, and the receptacle is configured for housing the cables.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
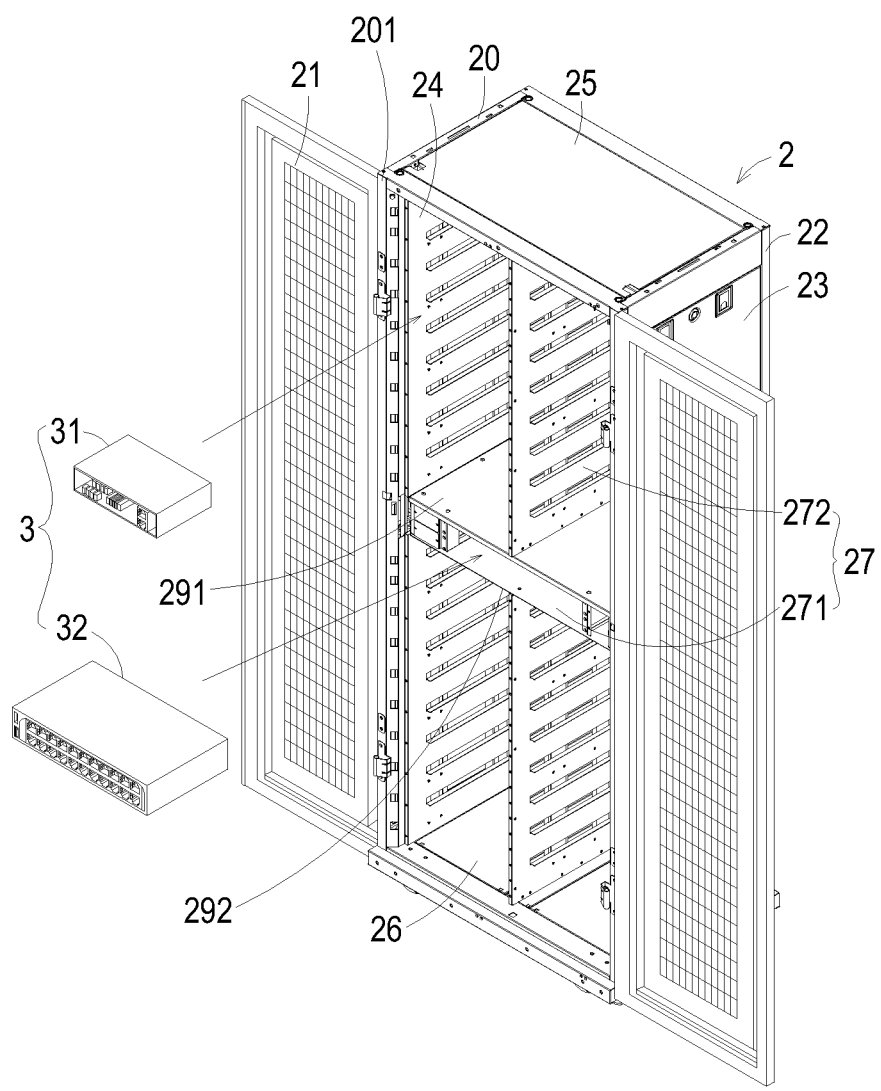
FIG. 1 is a schematic view illustrating a rack mounted computer system according to an embodiment of the present invention.

FIG. 1 is a schematic view illustrating a rack mounted computer system according to an embodiment of the present invention. The rack mounted computer system 1 includes a rack 2, a plurality of retractable IT equipments 3 (information technology and telecommunications equipment) including a plurality of first IT equipments such as modular servers 31 and one or more second IT equipment such as modular network switch 32, and a plurality of cables 4. The rack 2 includes a frame assembly 20, a front door 21, a rear door 22, a first side panel 23, a second side panel 24 opposite to the first side panel 23, a top panel 25, a bottom panel 26 and an interior 27. The front door 21 and the rear door 22 are mesh panels or doors constructed to facilitate airflow passage through the interior 27 of the rack 2. The first side panel 23, the second side panel 24, the top panel 25 and the bottom panel 26 are respectively made of a solid construction that can obstruct airflow. The frame assembly 20 includes a front door frame 201, a rear door frame (not shown) and a plurality of side frames (not shown). The front door 21 and the rear door 22 are pivotally connected to the front door frame 201 and the rear door frame of the frame assembly 20, respectively. The interior 27 of the rack 2 is divided into at least one first compartment 271 for installing the one or more modular network switch 32 and a plurality of second compartments 272 for installing the modular servers 31. Preferably, one modular network switch 32 is installed into the first compartment 271. The first compartment 271 is defined by the first side panel 23, the second side panel 24, a first partition panel 291 and a second partition panel 292.

Figure 2A:
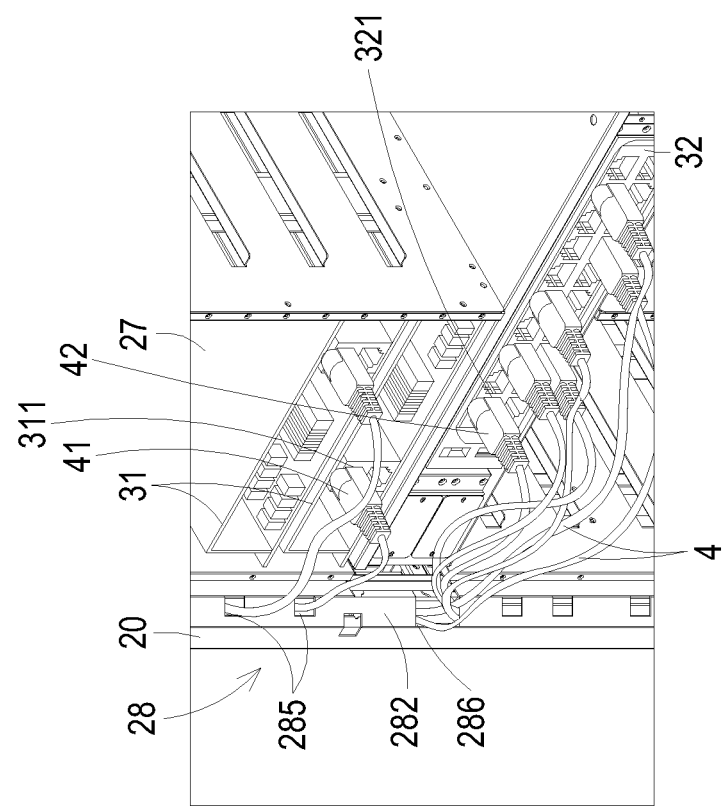
FIG. 2A schematically illustrates the rack mounted computer system of FIG. 1 employing a cable management mechanism for managing and securing cables between the network switch and the modular servers.
Figure 2B:
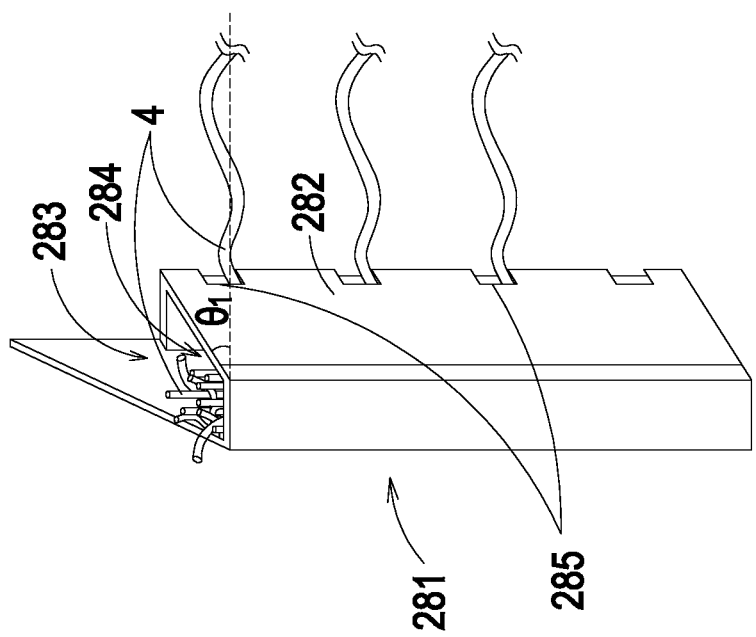
FIG. 2B schematically illustrates the cable management mechanism of FIG. 2A.

FIG. 2A schematically illustrates the rack mounted computer system of FIG. 1 employing a cable management mechanism for managing and securing cables between the network switch and the modular servers; and FIG. 2B schematically illustrates the cable management mechanism of FIG. 2A. As shown in FIGS. 1, 2A and 2B, the modular network switch 32 is installed into a corresponding receiving portion (i.e. first compartment 271) arranged at the middle area of the interior 27 of the rack 2, and the modular servers 31 are retractably installed into the corresponding receiving portions (i.e. second compartments 272) of the interior 27 of the rack 2. The rack 2 includes a cable management mechanism 28 for managing and securing the cables 4 connected between the network switch 32 and the modular servers 31. The cable management mechanism 28 is integrally formed with the front door frame 201 of the frame assembly 20 of the rack 2. The cable management mechanism 28 includes a polygonal column 281 having an inclined sidewall 282, a slit 283 and a receptacle 284. When the front door 21 is closed with respect to the frame assembly 20, the angle $\theta_1$ formed between the inclined sidewall 282 of the cable management mechanism 28 and the front door 21 is an acute angle.

The inclined sidewall 282 has a plurality of through holes 285 and an opening 286 arranged apart from each other at same intervals. The through holes 285 are in communication with the receptacle 284 and respectively configured to contain a corresponding cable 4 extending therethrough. The opening 286 is in communication with the receptacle 284 and configured to collect and contain the plurality of cables 4 inserted therethrough. The receptacle 284 is configured for housing the cables 4. The slit 283 can facilitate the operator to arrange the cables 4 inside the receptacle 284 and route the cables 4 to pass through the respective through hole 285 from the side of the rack 2 when the first side panel 23 or the second side panel 24 is disassembled from the frame assembly 20 of the rack 2. Therefore, the operator can manage, secure and route the cables 4 conveniently, accurately and easily. The front door 21 can be pivotally connected to the front door frame 201 and can be closed and opened normally without obstructing the distributions of the cables at the front of the rack 2.

Figure 3:
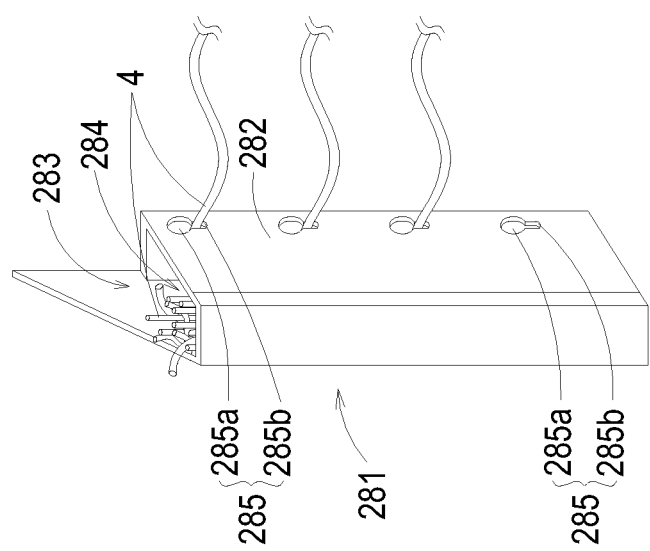
FIG. 3 schematically illustrates the cable management mechanism according to another embodiment of the present invention.

Each of the cable 4 has a first connector 41 and a second connector 42 at two opposite ends thereof. The first connector 41, which is extended out of a corresponding through hole 285, is used to connect with the first network port 311 of a corresponding modular server 31. The second connector 42, which is extended out of the opening 286, is used to connect with a second network port 321 of the network switch 32. The middle segment of the cable 4 is received within the receptacle 284. In some embodiment, as shown in FIG. 3, the through hole 285 includes a first aperture 285a and a second aperture 285b in communication with the first aperture 285a. The size of the second aperture 285b is smaller than that of the first aperture 285a so that the through hole 285 is substantial in the shape of a key hole. The first connector 41 of the cable 4 can pass through the first aperture 285a and then the cable 4 can be clamped by the second aperture 285b. It is to be noted that the profile of the through hole 285 is not limited thereto.

From the above description, the present invention provides a rack mounted computer system with a cable management mechanism for managing and securing cables without restricting the use of front door of the rack and restricting movement of the modular servers. In addition, the rack mounted computer system has a cable management mechanism integrally formed with the rack so that the cables can be routed from the network switch to the modular servers more conveniently, accurately and easily and the front door of the rack stilled can be used to protect the IT equipments.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A rack mounted computer system, comprising:
   a rack comprising a frame assembly, a front door, a rear door, a first side panel, a second side panel opposite to the first side panel, a top panel, a bottom panel and an interior, wherein the frame assembly comprises a front door frame, a rear door frame and a plurality of side frames, and the front door is pivotally connected to the front door frame;
a plurality of modular servers installed in the interior of the rack;
at least one network switch installed in the interior of the rack;
a plurality of cables, each of which is connected with a corresponding modular server and the network switch; and
a cable management mechanism integrally formed with the frame assembly for managing and securing the cables connected between the network switch and the modular servers and comprising:
a polygonal column having an inclined sidewall and a receptacle, wherein the inclined sidewall has a plurality of through holes and an opening arranged apart from each other, the through holes are in communication with the receptacle and respectively configured to contain a corresponding cable extending therethrough, the opening is in communication with the receptacle and configured to collect and contain the cables inserted therethrough, and the receptacle is configured for housing the cables, and when the front door is closed with respect to the frame assembly, an angle formed between the inclined sidewall of the cable management mechanism and the front door is an acute angle.

2. The rack mounted computer system according to claim 1, wherein the front door and the rear door are mesh panels constructed to facilitate airflow passage through the interior of the rack.

3. The rack mounted computer system according to claim 1, wherein the cable management mechanism is integrally formed with the front door frame of the frame assembly of the rack.

4. The rack mounted computer system according to claim 1, wherein the interior of the rack is divided into at least one first compartment for retractably installing the at least one modular network switch and a plurality of second compartments for retractably installing the modular servers.

5. The rack mounted computer system according to claim 4, wherein the first compartment is arranged at a middle area of the rack.

6. The rack mounted computer system according to claim 1, wherein the polygonal column comprises a slit, which facilitates an operator to arrange the cables inside the receptacle and route the cables to pass through the respective through hole.

7. The rack mounted computer system according to claim 1, wherein each of the cables has a first connector and a second connector at two opposite ends thereof, wherein the first connector is extended out of a corresponding through hole and used to connect with a first network port of a corresponding modular server, the second connector is extended out of the opening and used to connect with a second network port of the network switch, and a middle segment of the cable is received within the receptacle.

8. The rack mounted computer system according to claim 1, wherein the through hole includes a first aperture and a second aperture in communication with the first aperture, wherein the size of the second aperture is smaller than that of the first aperture.

9. A cable management mechanism, which is integrally formed with a frame assembly of a rack for managing and securing a plurality of cables connected between a network switch and a plurality of modular servers mounted inside the rack, wherein the rack comprises a front door, a rear door, a first side panel, a second side panel opposite to the first side panel, a top panel and a bottom panel, and the frame assembly comprises a front door frame, a rear door frame and a plurality of side frames, and the front door is pivotally connected to the front door frame, the cable management mechanism comprising:
a polygonal column having an inclined sidewall and a receptacle, wherein the inclined sidewall has a plurality of through holes and an opening arranged apart from each other, the through holes are in communication with the receptacle and respectively configured to contain a corresponding cable extending therethrough, the opening is in communication with the receptacle and configured to collect and contain the cables inserted therethrough, the receptacle is configured for housing the cables, and when the front door is closed with respect to the frame assembly, an angle formed between the inclined sidewall of the cable management mechanism and the front door is an acute angle.

10. The cable management mechanism according to claim 9, wherein the polygonal column comprises a slit, which facilitates an operator to arrange the cables inside the receptacle and route the cables to pass through the respective through hole.

11. The cable management mechanism according to claim 9, wherein each of the cables has a first connector and a second connector at two opposite ends thereof, wherein the first connector is extended out of a corresponding through hole and used to connect with a first network port of a corresponding modular server, the second connector is extended out of the opening and used to connect with a second network port of the network switch, and a middle segment of the cable is received within the receptacle.

12. The cable management mechanism according to claim 9, wherein the through hole includes a first aperture and a second aperture in communication with the first aperture, wherein the size of the second aperture is smaller than that of the first aperture.

13. A rack mounted computer system, comprising:
a rack comprising a frame assembly, a front door, a rear door, a first side panel, a second side panel opposite to the first side panel, a top panel, a bottom panel and an interior, wherein the frame assembly comprises a front door frame, a rear door frame and a plurality of side frames, and the front door is pivotally connected to the front door frame;
a plurality of first IT equipments installed in the interior of the rack;
at least one second IT equipment installed in the interior of the rack;
a plurality of cables, each of which is connected with a corresponding first IT equipment and the second IT equipment; and
a cable management mechanism integrally formed with the front door frame and comprising:
a polygonal column having an inclined sidewall and a receptacle, wherein the inclined sidewall has a plurality of through holes and an opening arranged apart from each other, the through holes are in communication with the receptacle and respectively configured to contain a corresponding cable extending therethrough, the opening is in communication with the receptacle and configured to collect and contain the cables inserted therethrough, the receptacle is configured for housing the cables, and when the front door is closed with respect to the frame assembly, an angle formed between the inclined sidewall of the cable management mechanism and the front door is an acute angle.

14. The rack mounted computer system according to claim 13, wherein the first IT equipment is modular server and the second IT equipment is network switch.

15. The rack mounted computer system according to claim 13, wherein the polygonal column comprises a slit, which facilitates an operator to arrange the cables inside the receptacle and route the cables to pass through the respective through hole.

16. The rack mounted computer system according to claim 13, wherein each of the cables has a first connector and a second connector at two opposite ends thereof, wherein the first connector is extended out of a corresponding through hole and used to connect with a first network port of a corresponding first IT equipment, the second connector is extended out of the opening and used to connect with a second network port of the second IT equipment, and a middle segment of the cable is received within the receptacle.

17. The rack mounted computer system according to claim 13, wherein the through hole includes a first aperture and a second aperture in communication with the first aperture, wherein the size of the second aperture is smaller than that of the first aperture.

* * * * *